(12) United States Patent
Yu

(10) Patent No.: US 6,764,316 B1
(45) Date of Patent: Jul. 20, 2004

(54) STRADDLE-MOUNT ELECTRICAL CONNECTOR

(75) Inventor: Hung-Chi Yu, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/392,160

(22) Filed: Mar. 18, 2003

(30) Foreign Application Priority Data

Jan. 29, 2003 (TW) .......................................... 92201630

(51) Int. Cl.⁷ ......................... H01R 12/00; H05K 1/00
(52) U.S. Cl. .................................................... 439/79
(58) Field of Search ............................. 439/79, 59, 60, 439/61, 62, 630

(56) References Cited

U.S. PATENT DOCUMENTS

| | | |
|---|---|---|
| 5,127,839 A | 7/1992 | Korsunsky et al. |
| 5,383,095 A | 1/1995 | Korsunsky et al. |
| 5,584,708 A * | 12/1996 | Leong .......................... 439/79 |
| 6,231,355 B1 | 5/2001 | Trammel et al. |

* cited by examiner

Primary Examiner—Javaid H. Nasri
(74) Attorney, Agent, or Firm—Wei Te Chung

(57) ABSTRACT

An electrical connector (1) for being mounted to a printed circuit board having two rows of contacting pads on opposite faces thereof includes a housing (2) having a mounting face (23), a number of terminals (4) retained to the housing with two rows of tail portion (40) extending beyond the mounting face and two rows of mounting portions (400) extending from the tail portions, and a guide block (3) including a base (300) clamped between the two rows of the mounting portions of the terminals and having two opposite faces (30, 31), and a number of grooves (32) defined in the two opposite faces. A distance between the two rows of the contacting pads of the printed circuit board is larger than an original distance between the two rows of the mounting portions but smaller than a distance between the grooves in the two opposite faces of the guide block.

1 Claim, 4 Drawing Sheets

STRADDLE-MOUNT ELECTRICAL CONNECTOR

BACKGROUND OF THE INVENTION

1. Field of the Invention

The present invention relates to an electrical connector, and more particularly to a straddle-mount electrical connector.

2. Description of Related Art

Electrical connectors are widely used in personal computers and other electronic equipments for connecting printed circuit boards to other electronic devices. One type of electrical connector, so-called straddle-mount electrical connector, is usually mounted to a printed circuit board by two rows of tail portions of electrical terminals thereof straddling an edge of the printed circuit board. An original distance between two rows of the tail portions of the terminals is usually smaller than a thickness of the edge of the printed circuit board. In applications, the edge of the printed circuit board is inserted into between the tail portions of the terminals to be clamped by the tail portions. U.S. Pat. Nos. 5,127,839, 5,383,095 and 6,231,355 each disclose such a connector. However, since the original distance between the tail portions of the terminals is smaller than the thickness of the edge of the printed circuit board, when the edge of the printed circuit board is to be inserted into between the tail portions, a force both to overcome an inward pressure of the tail portions and to overcome a rearward friction between the tail portions and the edge is needed, which is relatively large and undersirable. In addition, the tail portions of the terminals are apt to be inadvertently deflect from their original positions by improperly operating before mounting to the printed circuit board, thereby adversely affecting the electrical connection between the terminals and contacting pads of the printed circuit board.

Hence, an improved electrical connector is desired to overcome the disadvantages of the prior art.

SUMMARY OF THE INVENTION

An object of the present invention is to provide a straddle-mount electrical connector which reduces an insertion force of an edge of a printed circuit board into between terminals thereof.

Another object of the present invention is to provide a straddle-mount electrical connector which accurately positions tail portions of terminals thereof before mounting to a printed circuit board.

To achieve the above objects, a straddle-mount electrical connector in accordance with the present invention for being straddle-mounted to a printed circuit board having two rows of contacting pads on opposite faces thereof comprises a housing having a mounting face, a plurality of terminals retained to the housing and comprising two rows of tail portions extending beyond the mounting face and a mounting portion extending from each tail portion, and a guide block comprising a base clamped between the two rows of the mounting portions of the terminals and defining two opposite faces and a plurality of grooves in the two opposite faces. The grooves receive the mounting portions of the terminals extending therethrough, respectively. A distance between the two rows of the contacting pads of the printed circuit board is larger than an original distance between the two rows of the mounting portions of the terminals but smaller than a distance between the grooves in the two opposite faces of the block.

Other objects, advantages and novel features of the invention will become more apparent from the following detailed description when taken in conjunction with the accompanying drawings.

DETAILED DESCRIPTION OF THE INVENTION

Figure 1:
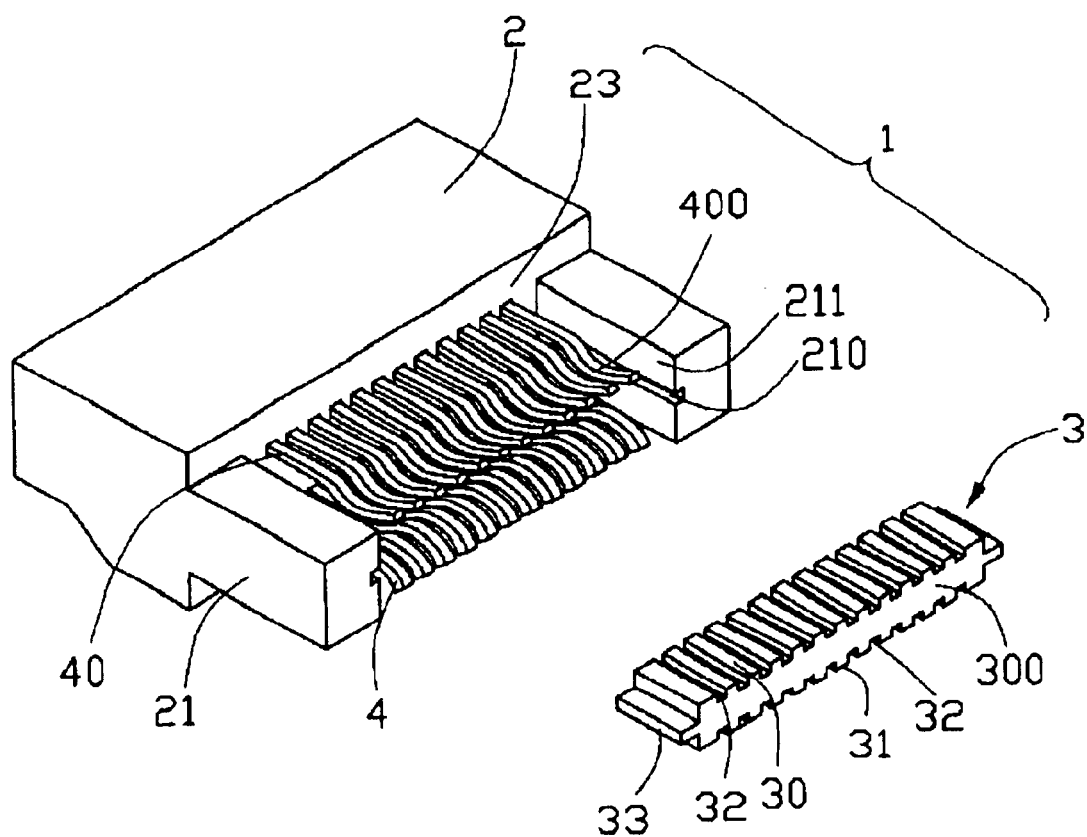
FIG. 1 is a partially exploded perspective view of a straddle-mount electrical connector in accordance with the present invention.
Figure 2:
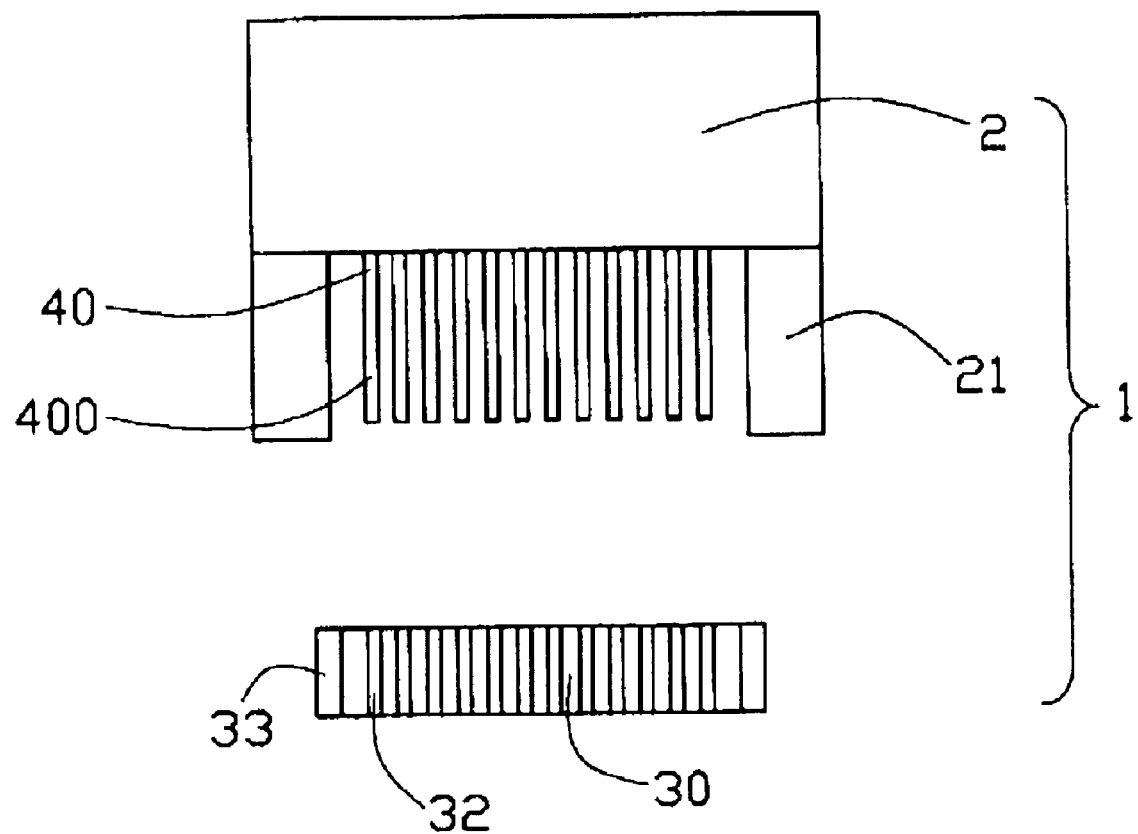
FIG. 2 is a top plan view of the straddle-mount electrical connector of FIG. 1.

Referring to FIGS. 1 and 2, a straddle-mount electrical connector 1 in accordance with the present invention comprises a insulative housing 2, a plurality of terminals 4 and a guide block 3.

The insulative housing 2 has a mounting face 23 and a pair of arms 21 extending from opposite ends of the mounting face 23 in a direction perpendicular to the mounting face 23. Each arm 21 defines a slot 210 extending longitudinally throughout an inner side 211 thereof.

The terminals 4 are retained to the housing 2 with two rows of tail portions 40 thereof extending beyond the mounting face 23 and between the two arms 21 of the housing 2. Two rows of mounting portions 400 extend rearwardly toward each other from ends of the tail portions 40. Free ends connecting with the two rows of the mounting portions 400 of the terminals 4 extend away from each other. An original distance between the two rows of the mounting portions 400 is smaller than a distance between the two rows of the tail portions 40 of the terminals 4.

The guide block 3 comprises an elongated base 300 having an upper face 30 and a lower face 31 opposite to the upper face 30, a pair of projections 33 extending laterally from opposite ends of the base 300, and a plurality of grooves 32 defined in the upper and the lower faces 30, 31. The grooves 32 extend throughout the base 300 in the mating direction of the electrical connector 1 and corresponding to the two rows of the terminals 4. A distance between the upper and the lower grooves 32 is larger than the original distance between the two rows of the mounting portions 400 of the terminals 4. A distance between the upper and the lower faces 30, 31 of the base 300 is larger than the distance between the upper and the lower grooves 32 and is smaller than a distance between the two rows of the tail portions 40 of the terminals 4.

Figure 3:
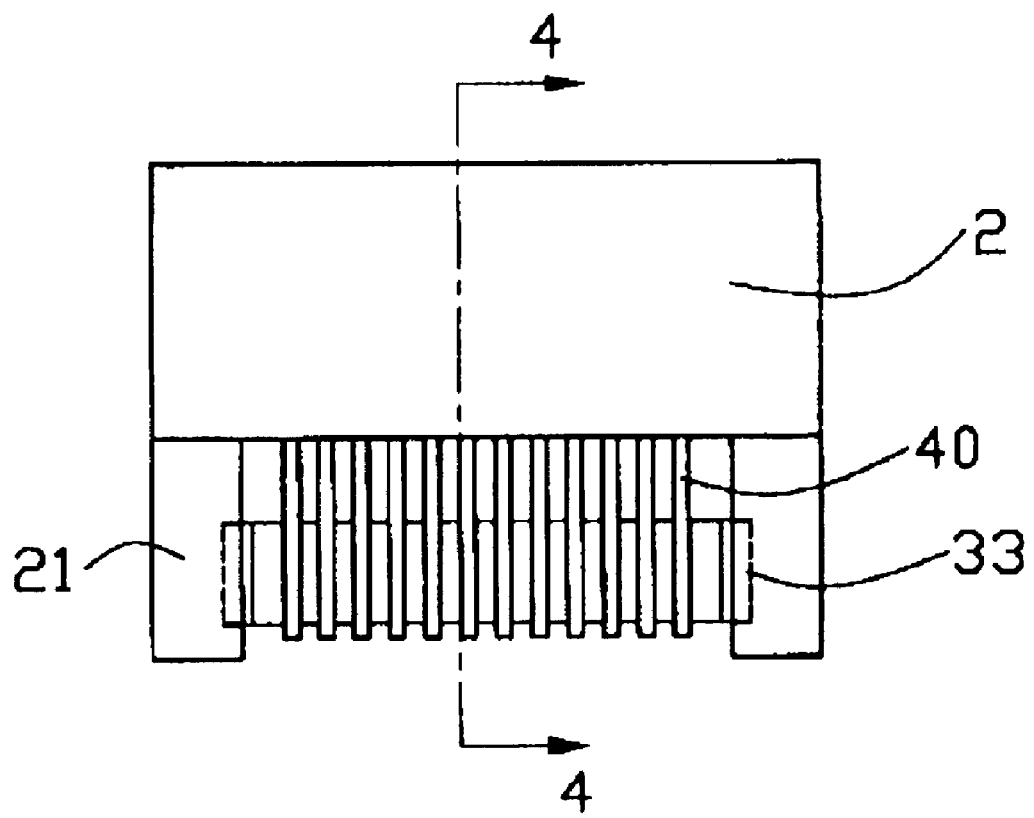
FIG. 3 is a view similar to FIG. 2 but a guide block is assembled to a housing of the straddle-mount electrical connector.
Figure 4:
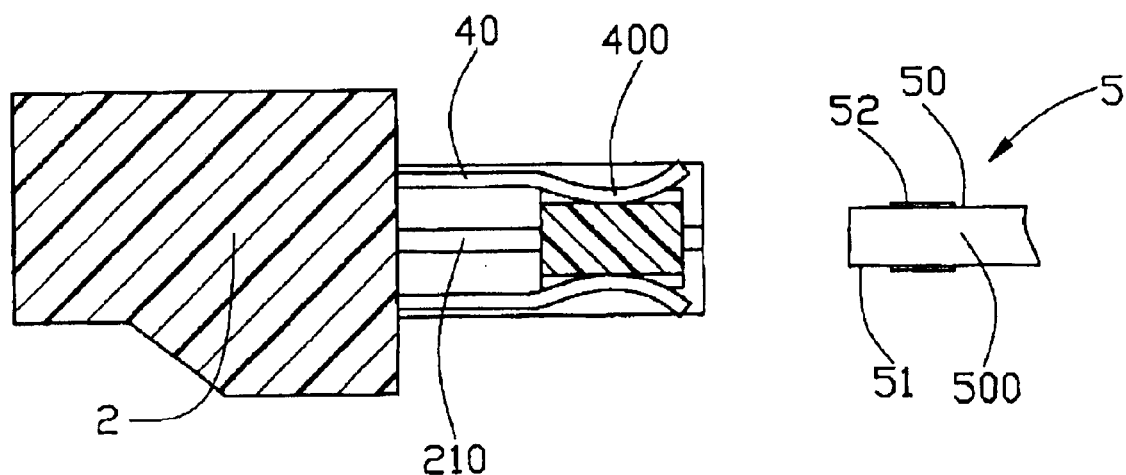
FIG. 4 is a cross-sectional view taken along line 4—4 of FIG. 3 with a printed circuit board to which the straddle-mount electrical connector is mounted shown.

Referring to FIGS. 3 and 4, the guide block 3 is assembled to the housing 2 with the projections 33 thereof received in the slots 210 of the housing 2 and the grooves 32 thereof receiving the mounting portions 400 of the terminals 4, respectively. Since the original distance between the two rows of the mounting portions 400 of the terminals 4 is smaller than the distance between the upper and the lower grooves 32 of the guide block 3, the mounting portions 400 of the terminals 4 are deflected slightly away from their original positions during the course of inserting the guide block 3 into therebetween.

A printed circuit board 5 to which the electrical connector 1 is mounted comprises a mounting edge 500 having an upper face 50 and a lower face 51. Two rows of contacting pads 52 are disposed on the upper and the lower faces 50, 51 and correspond to the two rows of the mounting portions 400 of the terminals 4. A distance between the two rows of the contacting pads 52 is slightly larger than the original distance between the two rows of the mounting portions 400 of the terminals 4 but smaller than the distance between the upper and the lower grooves 32.

Figure 5:
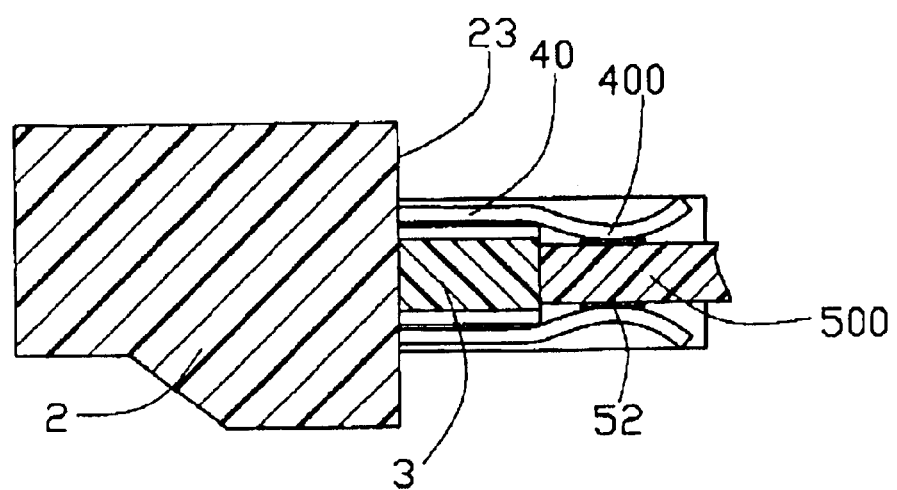
FIG. 5 is a view similar to FIG. 4 but the straddle-mount electrical connector has been mounted to the printed circuit board.

Referring to FIG. 5, when the electrical connector 1 is to be mounted to the printed circuit board 5, the mounting edge 500 of the printed circuit board 5 pushes the guide block 3 to slide in the slots 210 of the housing 2. Since the distance between the upper and the lower grooves 32 of the guide block 3 is larger than the distance between the two rows of the contacting pads 52 of the printed circuit board 5, the mounting edge 500 of the printed circuit board 5 is blocked only by a friction in insertion direction between the mounting portions 400 of the terminals 4 and the guide block 3 need not deflect the mounting portions 400 of the terminals 4 outwardly. Further pushing the printed circuit board 5, the guide block 3 slides into between the two rows of the tail portions 40 of the terminals 4, the mounting portions 400 of the terminals 4 resume by their own elasticity and clamp the contacting pads 52 of the printed circuit board 5 to mechanically and electrically connect the electrical connector 1 and the printed circuit board 5.

Since the printed circuit board 5 is blocked only by the friction in the insertion direction between the mounting portions 400 of the terminals 4 and the grooves 32 of the guide block 3, the insertion force of the printed circuit board 5 is reduced. It is to be understood, the more smooth surfaces of the grooves 32 are, the less the friction is. In addition, the mounting portions 400 of the terminals 4 are received in the grooves 32 of the guide block 3 before mounting to the printed circuit board 5, so the mounting portions 400 can be positioned accurately to the contacting pads 52 of the printed circuit board 5.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector, comprising: an insulative housing comprising a mounting face; a plurality of terminals retained to the insulative housing and comprising two rows of tail portions extending beyond the mounting face of the insulative housing, each tail portion having a mounting portion; and a guide block movably clamped between the two rows of mounting portions of the terminals; wherein the insulative housing comprises a pair of arms extending from the mounting face and defining a pair of slots therein, and wherein the guide block comprises a pair of projections received in the slots; wherein the guide block comprises a base defining two opposite faces and a plurality of grooves in the two opposite faces to receive the mounting portions of the terminals, respectively, wherein the two rows of mounting portions of the terminals define an original distance therebetween smaller than a distance defined between two rows of contacting pads on opposite faces of a printed circuit board to which the electrical connector is to be mounted; wherein a distance defined between the two rows of mounting portions received in the grooves of the guide block is larger than the distance defined between the two rows of the contacting pads on the opposite faces of the printed circuit board.

* * * * *